United States Patent
Huang

(10) Patent No.: US 12,416,456 B2
(45) Date of Patent: Sep. 16, 2025

(54) LIQUID COOLING RADIATOR FOR LIQUID COOLERS

(71) Applicant: Tsung-Hsien Huang, I-Lan Hsien (TW)

(72) Inventor: Tsung-Hsien Huang, I-Lan Hsien (TW)

(*) Notice: Subject to any disclaimer, the term of this patent is extended or adjusted under 35 U.S.C. 154(b) by 191 days.

(21) Appl. No.: 18/133,482

(22) Filed: Apr. 11, 2023

(65) Prior Publication Data

US 2024/0318926 A1    Sep. 26, 2024

(30) Foreign Application Priority Data

Mar. 21, 2023 (TW) .................. 112110353

(51) Int. Cl.
| | |
|---|---|
| *F28F 9/02* | (2006.01) |
| *F28F 1/04* | (2006.01) |
| *F28F 1/12* | (2006.01) |
| *H01L 23/473* | (2006.01) |
| *H05K 7/20* | (2006.01) |

(52) U.S. Cl.
CPC .............. *F28F 9/0217* (2013.01); *F28F 1/04* (2013.01); *F28F 1/126* (2013.01); *F28F 2250/08* (2013.01); *H01L 23/473* (2013.01); *H05K 7/20263* (2013.01); *H05K 7/20272* (2013.01); *H05K 7/20327* (2013.01)

(58) Field of Classification Search
CPC ........... H05K 7/20272; H05K 7/20263; H05K 7/20327; H01L 23/473; F28D 1/05341; F28F 2250/08; F28F 9/0217
See application file for complete search history.

(56) References Cited

U.S. PATENT DOCUMENTS

| | | | |
|---|---|---|---|
| 6,357,521 B1 * | 3/2002 | Sugimoto ........... | F28D 1/05366 165/173 |
| 8,051,898 B2 * | 11/2011 | Chiang ................. | H01L 23/473 417/313 |
| 9,600,044 B2 * | 3/2017 | Liao ........................ | G06F 1/187 |

(Continued)

FOREIGN PATENT DOCUMENTS

| | | | | |
|---|---|---|---|---|
| CN | 112444050 A | * | 3/2021 | .......... F04D 29/426 |
| JP | 2016205718 A | * | 12/2016 | |

OTHER PUBLICATIONS

Translation of JP2016205718A named Translation-JP2016205718A (Year: 2016).*

*Primary Examiner* — Paul Alvare
(74) *Attorney, Agent, or Firm* — Ying-Ting Chen; Law Office of Michael Chen

(57) ABSTRACT

The invention discloses a liquid cooling radiator for liquid coolers, which includes a shunt box, a liquid collection box and heat dissipation pipes connected between the shunt box and the liquid collection box. The inside of the shunt box is divided into a hot liquid inlet chamber and a cold liquid outlet chamber by a heat-resistant space. The heat-resistant space is composed of a hot liquid baffle and a cold liquid baffle combined in the shunt box at intervals to form the heat-resistant space between the hot liquid baffle and the cold liquid baffle, which can prevent the hot liquid baffle and the cold liquid baffle from contacting each other to transfer heat, and prevent the cooled cold liquid from being affected by the hot liquid before flowing out of the liquid cold row, causing the problem of heating up.

6 Claims, 10 Drawing Sheets

(56) References Cited

U.S. PATENT DOCUMENTS

| | | | |
|---|---|---|---|
| 9,927,181 B2* | 3/2018 | Mouniloux | G06F 1/20 |
| 2004/0008483 A1* | 1/2004 | Cheon | G06F 1/20 |
| | | | 361/699 |
| 2005/0052847 A1* | 3/2005 | Hamman | F28F 13/125 |
| | | | 361/689 |
| 2006/0018775 A1* | 1/2006 | Oikawa | F04D 29/588 |
| | | | 257/E23.098 |
| 2006/0051222 A1* | 3/2006 | Lee | F04D 13/0666 |
| | | | 417/423.1 |
| 2006/0185378 A1* | 8/2006 | Duan | H05K 7/20263 |
| | | | 62/259.2 |
| 2007/0103869 A1* | 5/2007 | Liu | H01L 23/473 |
| | | | 257/E23.098 |
| 2008/0105407 A1* | 5/2008 | Yeh | H01L 23/467 |
| | | | 257/E23.098 |
| 2009/0044929 A1* | 2/2009 | Yeh | F28D 15/00 |
| | | | 165/104.19 |
| 2011/0056668 A1* | 3/2011 | Taras | F28F 9/262 |
| | | | 165/174 |
| 2013/0299139 A1* | 11/2013 | Mounioloux | H01L 23/467 |
| | | | 165/120 |
| 2017/0027081 A1* | 1/2017 | Zhang | H01L 23/473 |
| 2017/0367217 A1* | 12/2017 | Xiao | H01L 23/467 |
| 2018/0094633 A1* | 4/2018 | Huang | F04D 13/12 |
| 2019/0075681 A1* | 3/2019 | Xiao | F28F 1/126 |
| 2019/0249939 A1* | 8/2019 | Otsuki | F28F 19/002 |
| 2019/0343018 A1* | 11/2019 | Chen | F28D 1/0233 |
| 2020/0236807 A1* | 7/2020 | Deng | F28F 27/02 |
| 2022/0170705 A1* | 6/2022 | Huang | F28F 9/0202 |

* cited by examiner

LIQUID COOLING RADIATOR FOR LIQUID COOLERS

BACKGROUND OF THE INVENTION

(a) Field of the Invention

The present invention relates to the technical field of liquid coolers, in particular to a liquid cooling radiator for liquid coolers used in cooling systems of computers and servers.

(b) Description of the Prior Art

The known liquid cooling system for computers and servers (such as shown in US20090044929) comprises three main components: a liquid cooling head, a radiator and a liquid pump, which are connected between the three through liquid pipes to form a closed circulation liquid cooling system. The radiator structure usually comprises a shunt box, a liquid collection box, a plurality of pipes and a plurality of cooling fins. These row pipes are arranged together at intervals, so that one end is connected to the shunt box, and the other end is connected to the liquid collection box. The cooling fins are combined on the outside of the pipes. Generally speaking, a metal plate is used as a liquid barrier inside the distribution box to divide the inner space of the shunt box into a liquid inlet chamber and a liquid outlet chamber. After the hot liquid flows into the liquid inlet chamber, it flows to the liquid collection box through a part of the pipes, and then flows back from the liquid collection box to the liquid outlet chamber in the shunt box through the other part of the discharge pipes. During this process, the hot liquid entering the liquid inlet chamber cools down and becomes cold liquid when it reaches the liquid outlet chamber.

However, the above-mentioned known radiator has the following disadvantages: (1) The inside of the shunt box uses a metal plate as the liquid barrier between the liquid inlet chamber and the liquid outlet chamber, so that the hot liquid in the liquid inlet chamber is heat-conducted to the liquid outlet chamber through the liquid barrier, so that the cold liquid that has been cooled in the liquid outlet chamber is heated up again, thereby reducing the heat dissipation and cooling effect of the radiator on the liquid. (2) The heat conduction efficiency is positively correlated with the area in contact with heat, and the above-mentioned conventional row pipes are flat pipes with a long strip shape, and the area in contact with the liquid is only the part of the inner wall of the pipes, so it is difficult to increase the heat dissipation area. (3) These row pipes are made of aluminum alloy, and the pipe walls are too thin, resulting in poor structural strength and prone to deformation. (4) The box walls of the shunt box and the liquid collection box are also too thin, which also have the disadvantages of poor structural strength and easy deformation.

SUMMARY OF THE INVENTION

The main object of the present invention is to provide a liquid cooling radiator for liquid coolers. Through the structural design inside the shunt box, the hot liquid entering the shunt box cannot be heat-conducted to the adjacent cold liquid, so that the cold liquid after heat dissipation can be kept at a low temperature to flow out of the liquid cooling radiator.

In order to achieve the above object, the present invention provides a liquid cooling radiator for liquid coolers, which is divided into a hot liquid inlet chamber and a cold liquid outlet chamber that are not directly connected by a heat-resistant space in the internal space of the liquid cooling radiator. The heat-resistant space is composed of a hot liquid baffle and a cold liquid baffle assembled at intervals and combined in the inner space of the shunt box. The surrounding edges of the hot liquid baffle and the cold liquid baffle are welded to the inner box wall of the inner space of the shunt box, forming that the hot liquid inlet chamber and the cold liquid outlet chamber are not connected to the heat-resistant space, so that the heat-resistant space forming between the hot liquid baffle and the cold liquid baffle can prevent the hot liquid baffle and the cold liquid baffle from contacting each other to transfer heat.

Another object of the present invention is to provide a liquid cooling radiator for liquid coolers, which can achieve the effect of improving heat dissipation and enhancing the structural strength of the pipes through the design of the pipe arrangement between the shunt box and the liquid collection box.

Still another object of the present invention is to provide a liquid cooling radiator for liquid coolers, which can increase the structural strength of the shunt box through the strengthening structure design of the inner box wall of the shunt box.

DETAILED DESCRIPTION OF THE PREFERRED EMBODIMENTS

Figure 1:
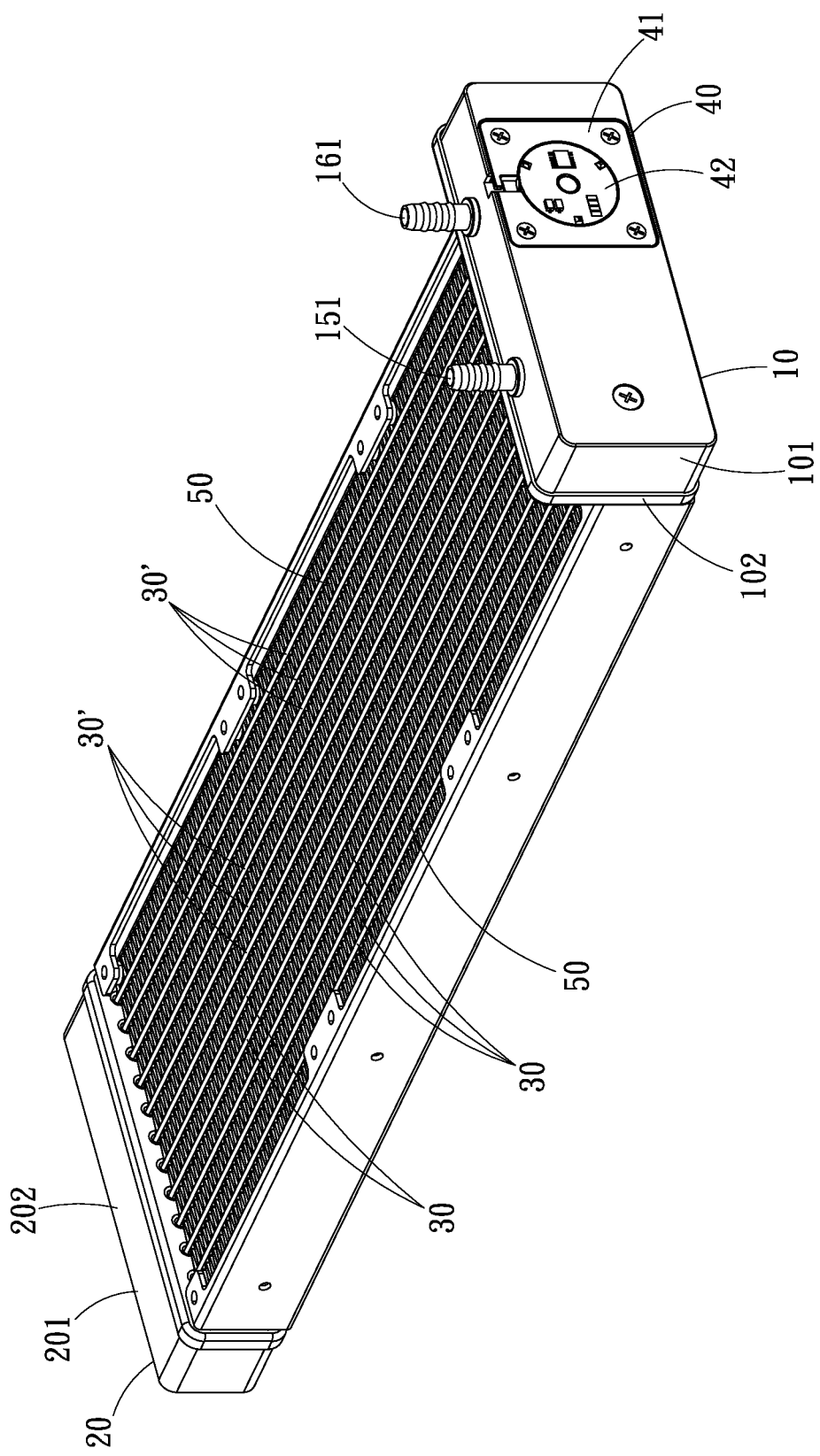
FIG. 1 is a schematic perspective view of the first preferred embodiment of the present invention.
Figure 2:
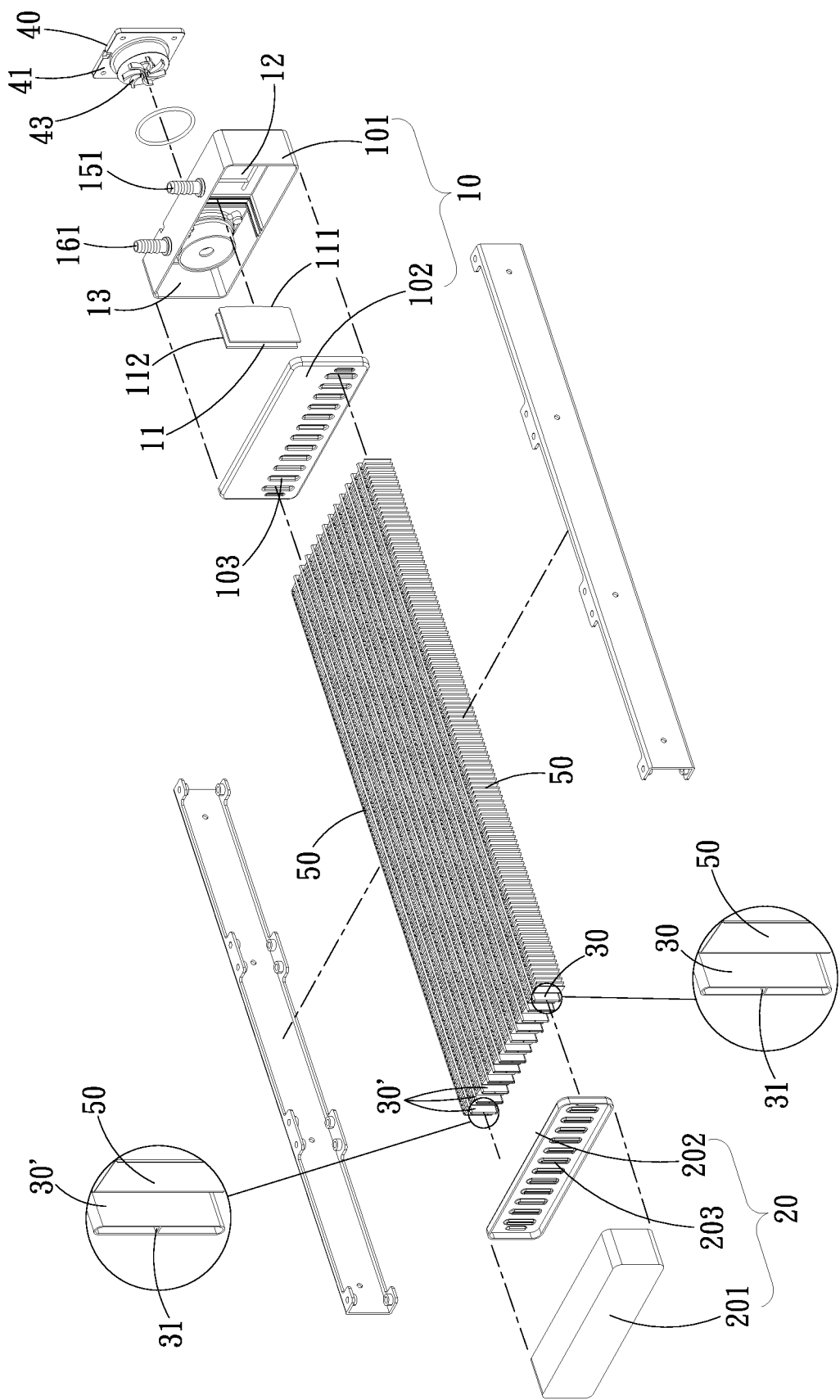
FIG. 2 is an exploded schematic view of the first preferred embodiment of FIG. 1 of the present invention.
Figure 3:
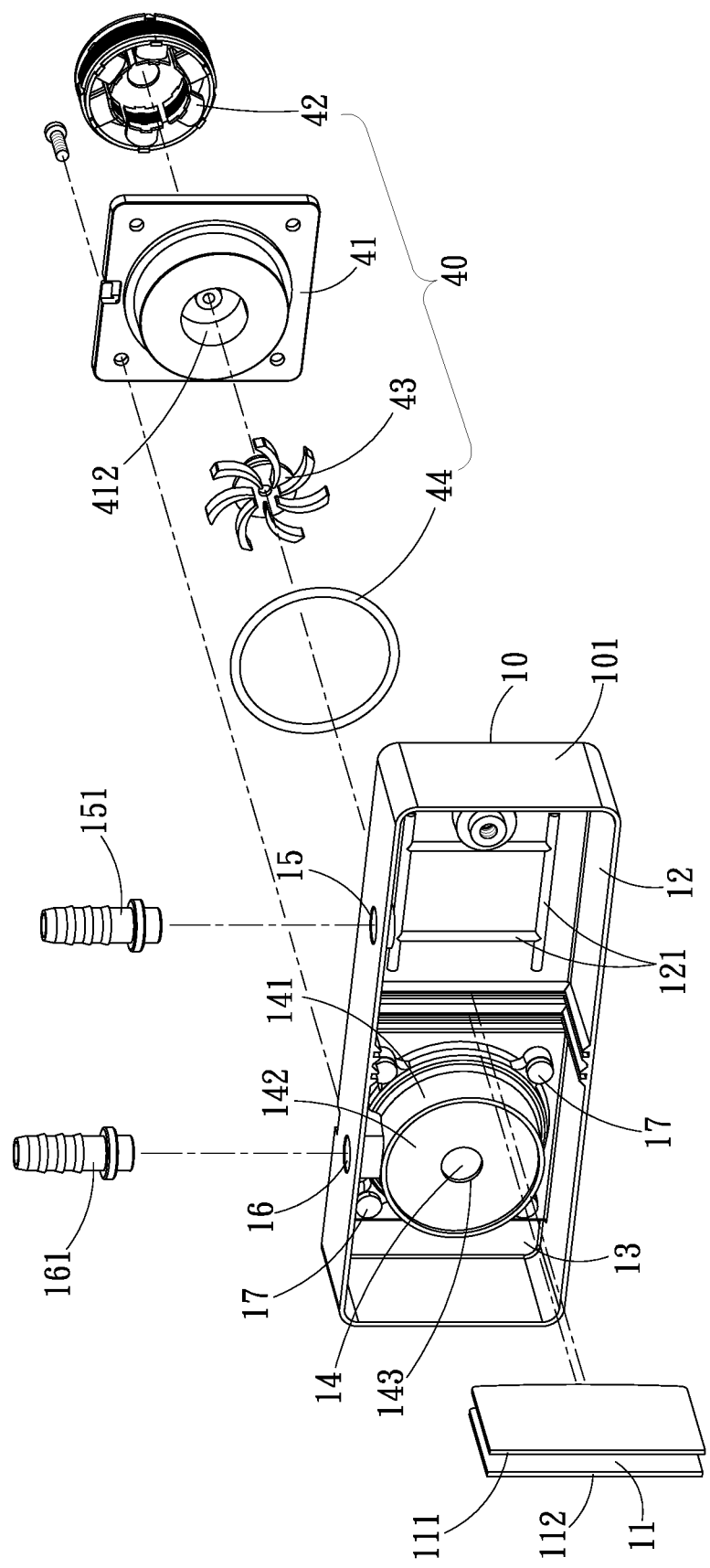
FIG. 3 is an exploded schematic view of the shunt box and the liquid pump in FIG. 2 in the first view of the present invention.

As shown in FIG. 1, FIG. 2 and FIG. 3, a kind of liquid cooling radiator for liquid coolers of the present invention is applied as a liquid cooling system for cooling systems of computers and servers, and its preferred embodiment comprises a shunt box 10, a liquid collection box 20, a plurality of heat dissipation pipes 30 and a liquid pump 40.

The shunt box 10 is an aluminum alloy integrally formed rectangular box with better heat dissipation, and its internal space is separated by a heat-resistant space 11 into a hot liquid inlet chamber 12 and a cold liquid outlet chamber 13 that are not directly connected. The hot liquid inlet chamber 12 and the cold liquid outlet chamber 13 are arranged side by side, and the cold liquid outlet chamber 13 is further provided with a liquid pump installation cavity 14. Wherein, the hot liquid inlet chamber 12 has a hot liquid inlet 15 passing through its box wall, and the hot liquid inlet 15 is combined with a liquid inlet pipe 151. The liquid pump installation cavity 14 is recessed into the cold liquid outlet chamber 13 from the outer wall of the shunt box 10. The liquid pump installation cavity 14 has a peripheral wall 141, a bottom wall 142 and a liquid outlet 143. One end of the peripheral wall 141 is integrally connected to the inner box wall of the cold liquid outlet chamber 13, and the opposite end of the peripheral wall 141 is integrally connected to the bottom wall 142. In this way, the liquid pump installation cavity 14 has an installation cavity opening 144 towards the outside of the shunt box. The liquid outlet 143 is arranged on the bottom wall 142 and communicates with the cold liquid outlet chamber 13 and the liquid pump installation cavity 14. The liquid pump installation cavity 14 has a cold liquid outlet 16 through its box wall, and the cold liquid outlet 16 is combined with a liquid outlet pipe 161.

Figure 4:
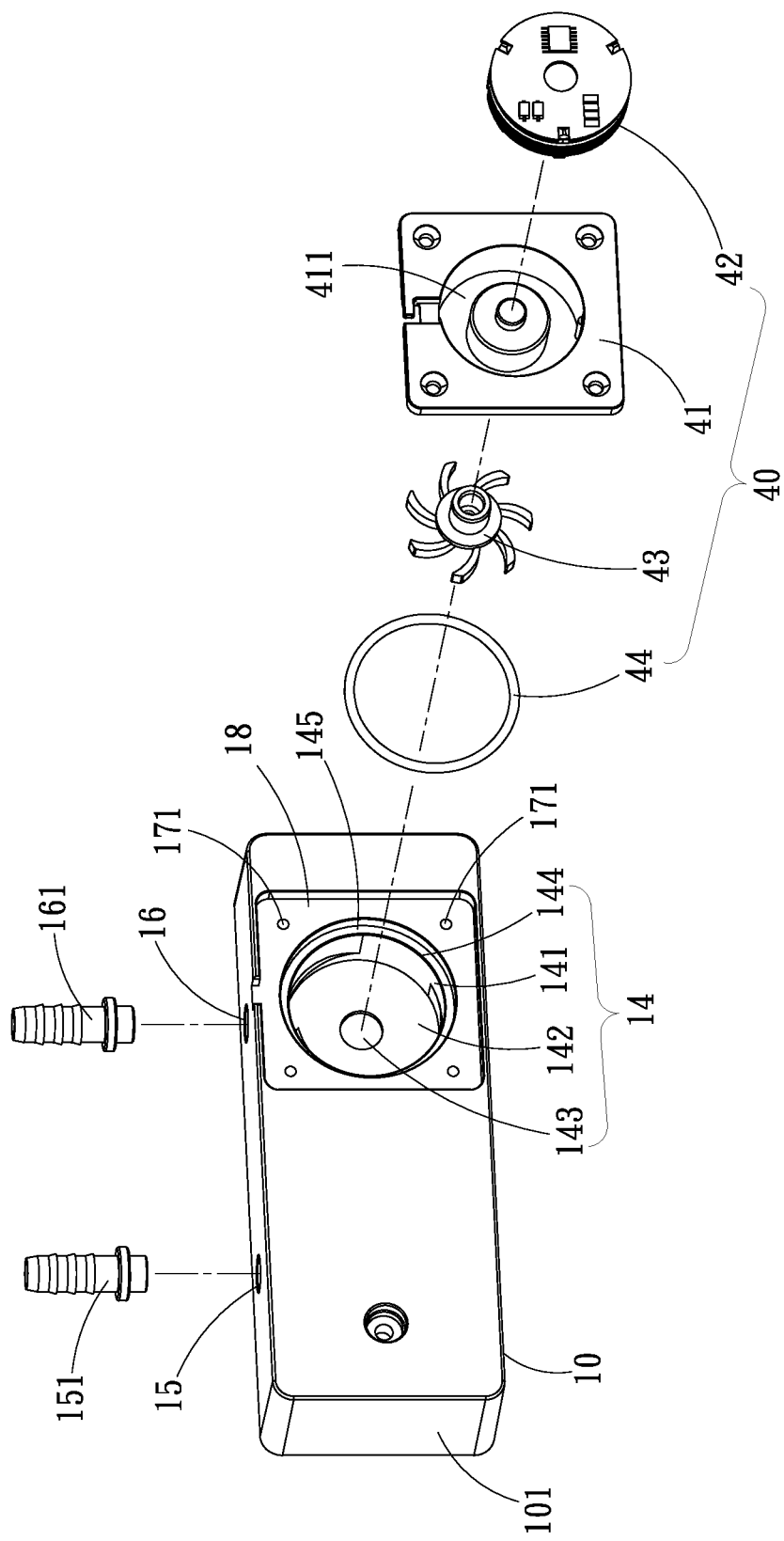
FIG. 4 is an exploded schematic view of the shunt box and the liquid pump in FIG. 2 in a second perspective of the present invention.
Figure 5:
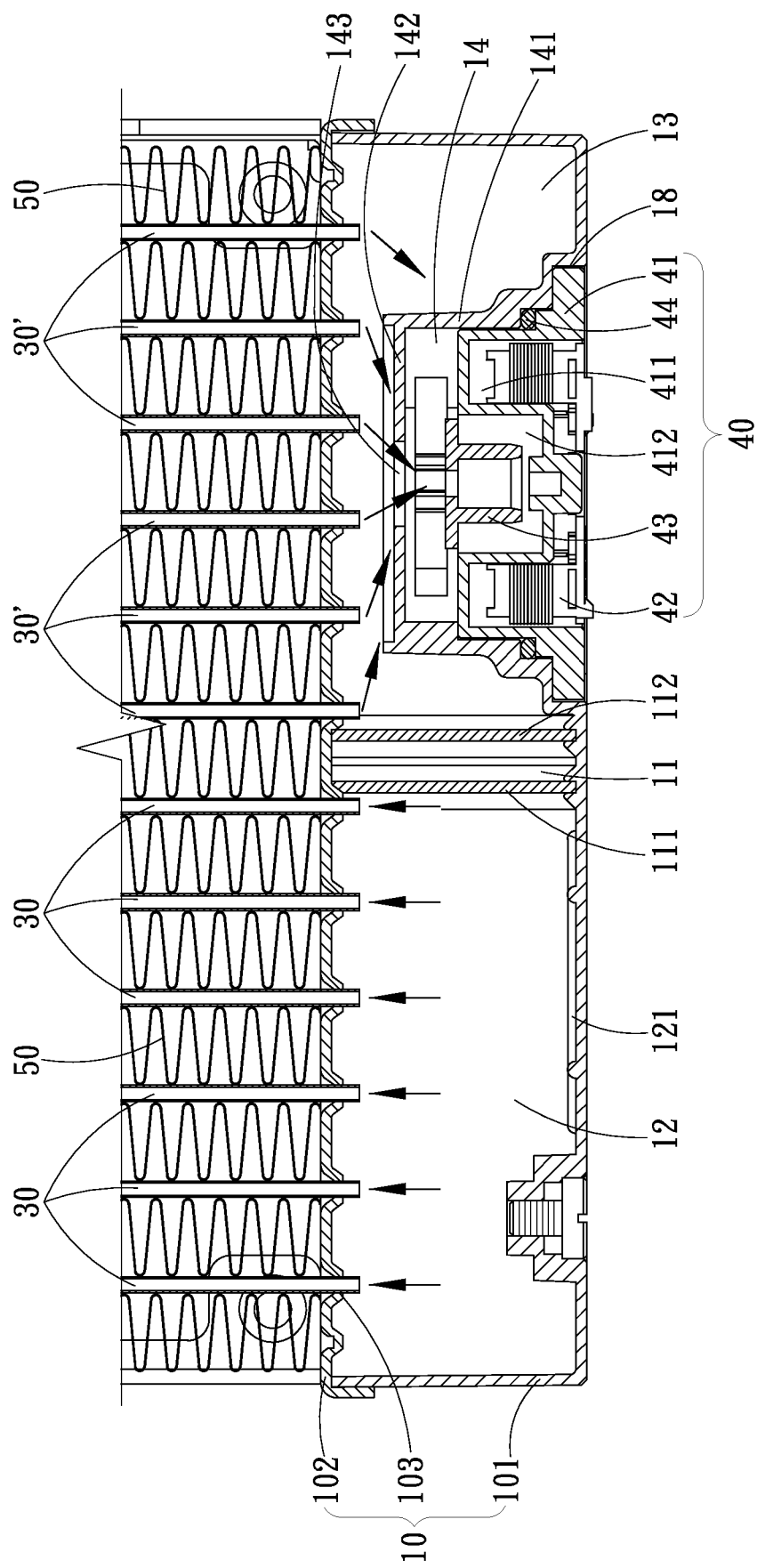
FIG. 5 is a schematic cross-sectional view of the shunt box and the heat-resistant space in FIG. 2 of the present invention.

As shown in FIG. 3, FIG. 4 and FIG. 5, the above-mentioned heat-resistant space 11 divides the inner space of the shunt box 10 into the hot liquid inlet chamber 12 and the cold liquid outlet chamber 13. The heat-resistant space 11 is composed of a hot liquid baffle 111 and a cold liquid baffle 112 assembled and combined in the inner space of the shunt box 10 at intervals. The surrounding edges of the hot liquid baffle 111 and the cold liquid baffle 112 are welded to the inner box wall of the inner space of the shunt box 10, forming that the hot liquid inlet chamber 12 and the cold liquid outlet chamber 13 are not connected to the heat-resistant space 11, so that the heat-resistant space 11 forming between the hot liquid baffle 111 and the cold liquid baffle 112 can prevent the hot liquid baffle 111 and the cold liquid baffle 112 from contacting each other to transfer heat. Therefore, even if the hot liquid in the hot liquid inlet chamber 12 transfers heat to the hot liquid baffle 111, since the heat-resistant space 11 only has air, the thermal conductivity of the air is only 2~25 h (W/m2·K), while the thermal conductivity coefficient of the aluminum alloy is about 130~150 h (W/m2·K), which is enough to prove that the heat-resistant space 11 of the present invention can prevent heat transfer from hot liquid to cold liquid.

As shown in FIG. 2 again, the above liquid collection box 20 is also an aluminum alloy integrally formed rectangular box with better heat dissipation. It is arranged at a distance relative to the shunt box 10, and its internal space forms a liquid collection cavity (not shown). The first ends of some of the heat dissipation pipes 30, 30' pass through the wall of the shunt box 10 to communicate with the hot liquid inlet chamber 12, and the first ends of the other part of the heat dissipation pipes 30' pass through the wall of the shunt box 10 to communicate with the cold liquid outlet chamber 13. The second ends of the heat dissipation pipes 30, 30' pass through the wall of the liquid collection box 20 to communicate with the internal liquid collection chamber, so that the heat dissipation pipes 30, 30' are connected between the shunt box 10 and the liquid collection boxes 20 to form a return channel, and heat dissipation fins 50 are respectively provided between the heat dissipation pipes 30 and 30'.

One of the more specific embodiments of the present invention, the shunt box 10 comprises a shunt box body 101 and a shunt box cover 102. The shunt box body 101 has an end wall and side walls connected around the end wall to form its inner space. The shunt box cover 102 closes the opening end of the inner space of the shunt box body 101. The shunt box cover 102 is provided with a plurality of pipe jacks 103 connected to the hot liquid inlet chamber 12 and the cold liquid outlet chamber 13. The first ends of the heat dissipation pipes 30, 30' pass through the pipe jacks 103 to connect to the hot liquid inlet chamber 12 and the cold liquid outlet chamber 13 respectively. The liquid collection box 20 has the same structure as the shunt box 10, and is also composed of a liquid collection box body 201, a liquid collection box cover 202 and a plurality of pipe jacks 203.

As shown in FIG. 3, FIG. 4 and FIG. 5, the above-mentioned liquid pump 40 is set in the liquid pump installation cavity 14 and closes the installation cavity opening 144. The liquid pump 40 can drive a hot liquid in the hot liquid inlet chamber 12 of the shunt box 10, so that the hot liquid flows through the heat dissipation pipes 30 to the liquid collection chamber in the liquid collection box 20, and then from the liquid collection chamber in the liquid collection box 20 to the cold liquid outlet chamber 13 of the shunt box 10 through another part of the heat dissipation pipes 30', making the hot liquid passing through the heat dissipation pipes 30, 30' to cool down to cold liquid. The cold liquid then flows into the liquid pump installation cavity 14 through the liquid outlet 143, and then flows out from the cold liquid outlet 16 and liquid outlet pipe 161, and the cold liquid is sent to a liquid cooling head (not shown) through a liquid pipe.

As shown in FIG. 2, the above-mentioned heat dissipation pipes 30, 30' are aluminum alloy pipes with elongated cross sections. One or more heat conducting metal plates 31 are integrally formed in the heat dissipation pipes 30, 30', and the heat conducting metal plates 31 are integrally connected between two opposite pipe walls of the respective heat dissipation pipe 30, 30'. Due to the design of the heat conducting metal plates 31, the contact area between the heat dissipation pipes 30, 30' and the hot liquid can be increased, and the heat conduction between the hot liquid and the heat dissipation pipes 30, 30' can be improved, so that the heat dissipation effect can be improved and the structural strength of the pipes can be enhanced.

As shown in FIG. 3, the inner box wall of the hot liquid inlet chamber 12 of the shunt box 10 of the present invention can be integrally formed with one or more ribs 121 to improve the structural strength of the box wall of the shunt box 10. In addition, the inner box wall of the shunt box 10 is integrally formed with four protrusions 17 protruding into the cold liquid outlet chamber 13, and the installation cavity opening 144 of the outer box wall of the shunt box 10 has four screw holes 171 respectively recessed into the protrusions. In this way, after the liquid pump 40 closes the installation cavity opening 144, screws can be used to pass through the liquid pump 40 and then locked into the screw holes 171, and the liquid pump 40 can be directly installed in the liquid cooling radiator of the present invention to achieve the effect of simplifying the liquid cooling system.

In order to install the liquid pump 40, a preferred embodiment of the present invention provides a rectangular slot 18 on the outer box wall of the shunt box 10, and the slot 18 is concave from the outer box wall to the inner box wall. The above-mentioned installation cavity opening 144 and screw holes 171 are located at the bottom of the slot 18. A sealing ring installation portion 145 with a larger diameter is further provided around the installation cavity opening 144. The liquid pump 40 implements a liquid pump cover 41, a motor stator 42, an impeller rotor 43 and a sealing ring 44. The liquid pump cover 41 is a rectangular cover whose shape matches the slot 18, and is used to insert the slot 18 when the liquid pump 40 is installed. The outer surface of the liquid pump cover 41 has a ring groove 411 concave to its inner surface, the inner surface of the liquid pump cover 41 has a concave hole 412 concave to its outer surface, and the concave hole 412 is coaxial with the ring groove 411. The motor stator 42 is set in the ring groove 411 outside the liquid pump cover 41, and seals the ring groove 411. The impeller rotor 43 is set in the concave hole 412 inside the liquid pump cover 41, so that the motor stator 42 can drive the impeller rotor 43 to rotate in the liquid pump installation cavity 13 through the liquid pump cover 41, driving the liquid to flow in the closed circulation system. The sealing ring 44 is set in the sealing ring installation portion 145, so that the sealing ring 44 abuts between the sealing ring installation portion 145 and the liquid pump cover 41 to achieve the effect of sealing and preventing leakage.

Figure 6:
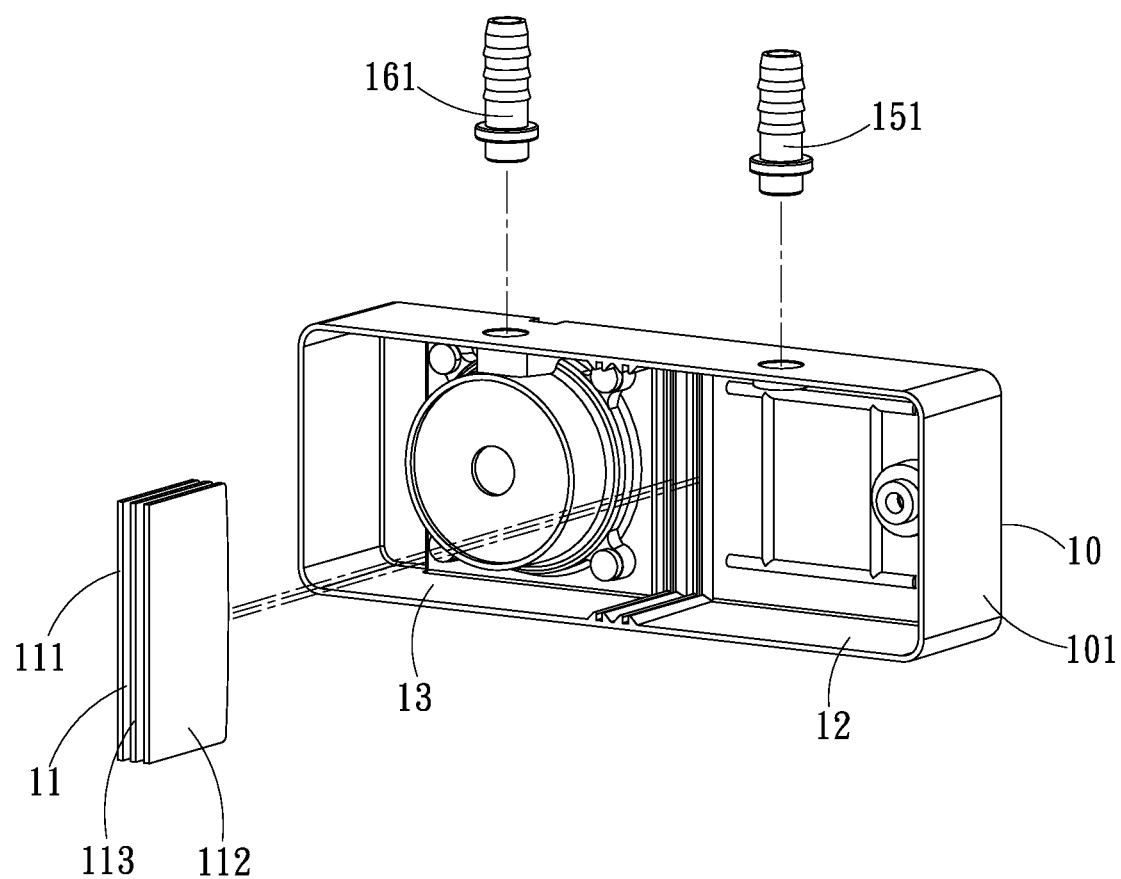
FIG. 6 is a schematic diagram of adding a heat shield to the heat-resistant space in FIG. 3 of the present invention.
Figure 7:
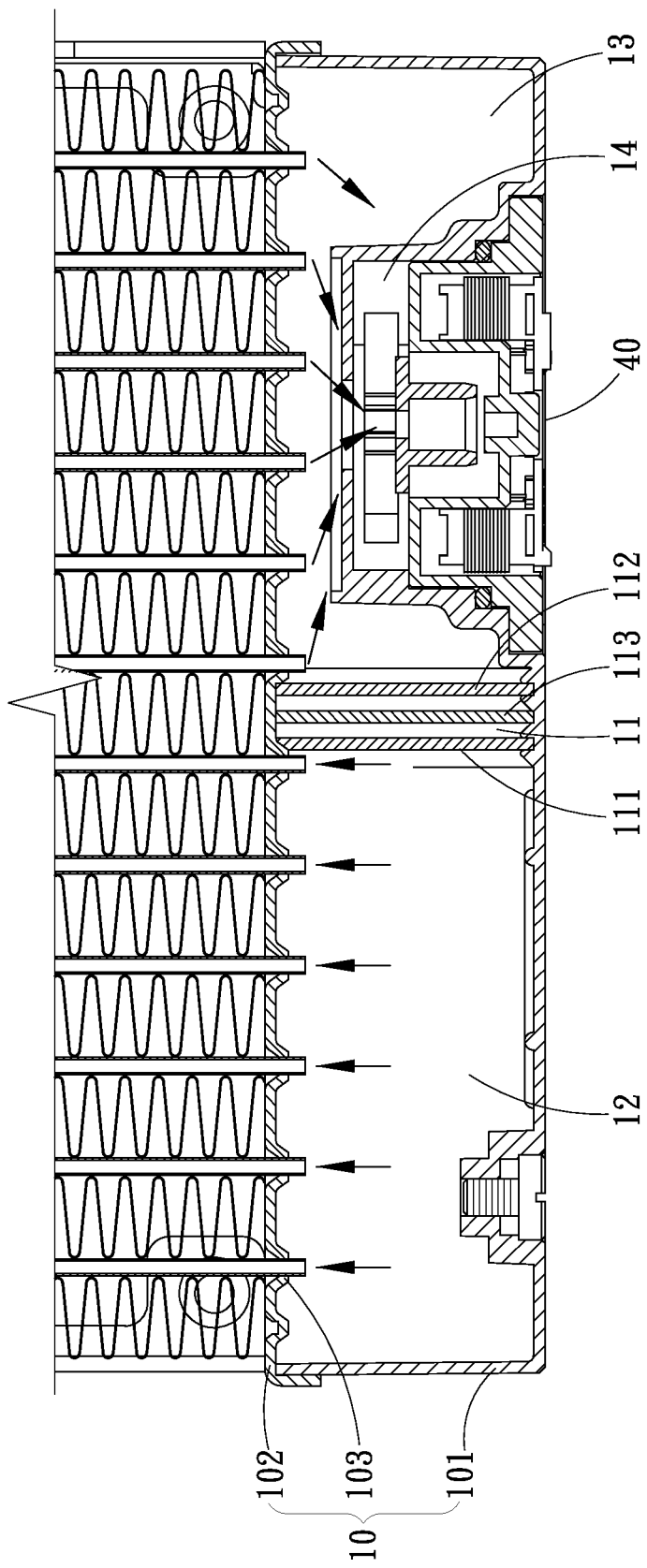
FIG. 7 is a schematic diagram of adding heat shield in the heat-resistant space in FIG. 6 of the present invention.

As shown in FIG. 6 and FIG. 7, in the present invention, the heat-resistant space 11 in the shunt box 10 can further be provided with a heat shield 113. The heat shield 113 is made of a material with a lower heat conduction system, so that the heat shield 113 is arranged in the heat-resistant space 11 and blocked between the hot liquid baffle 111 and the cold liquid baffle 112, so that the heat-resistant space 11 can achieve better heat insulation effect.

Figure 8:
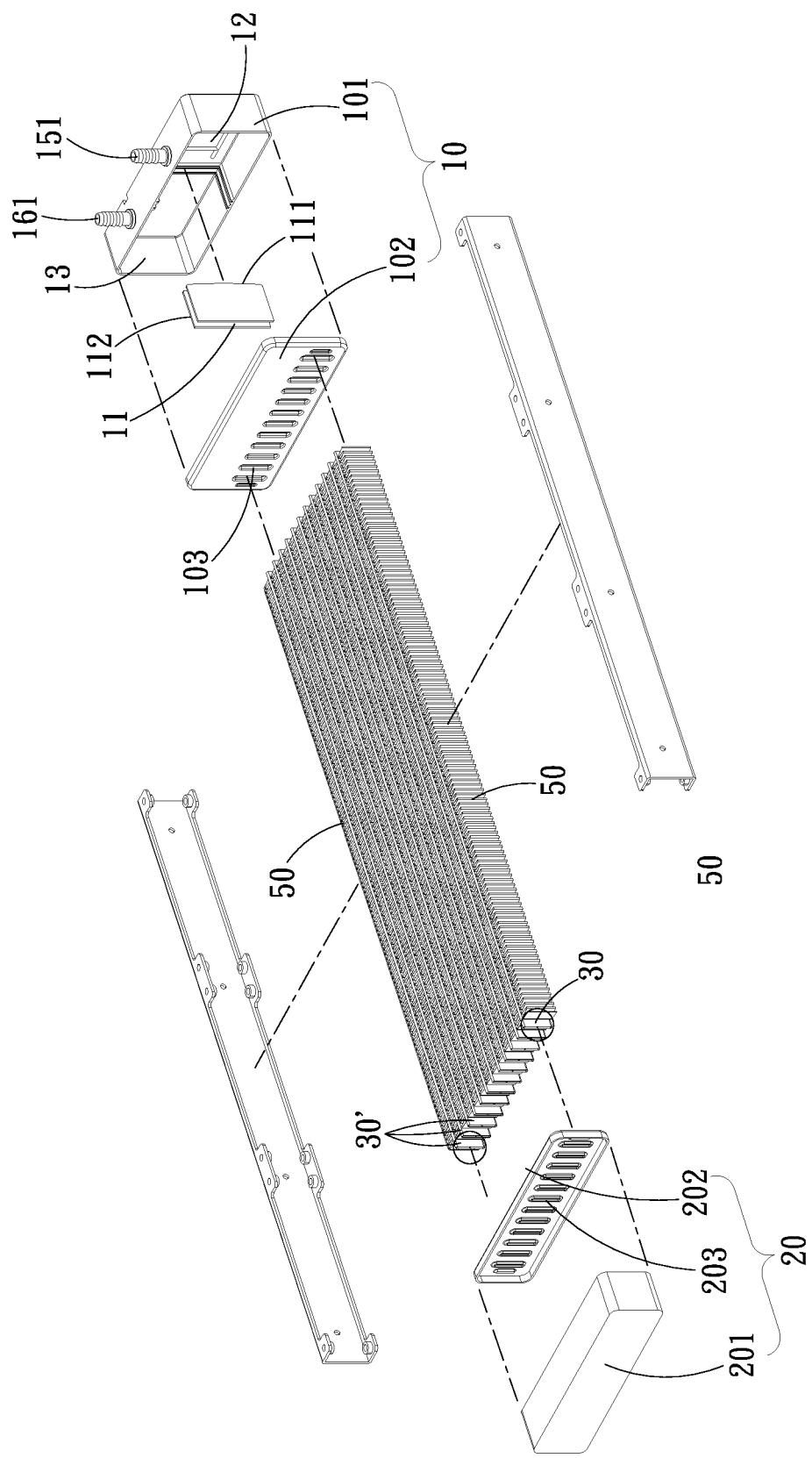
FIG. 8 is an exploded schematic view of the second preferred embodiment of the present invention.
Figure 9:
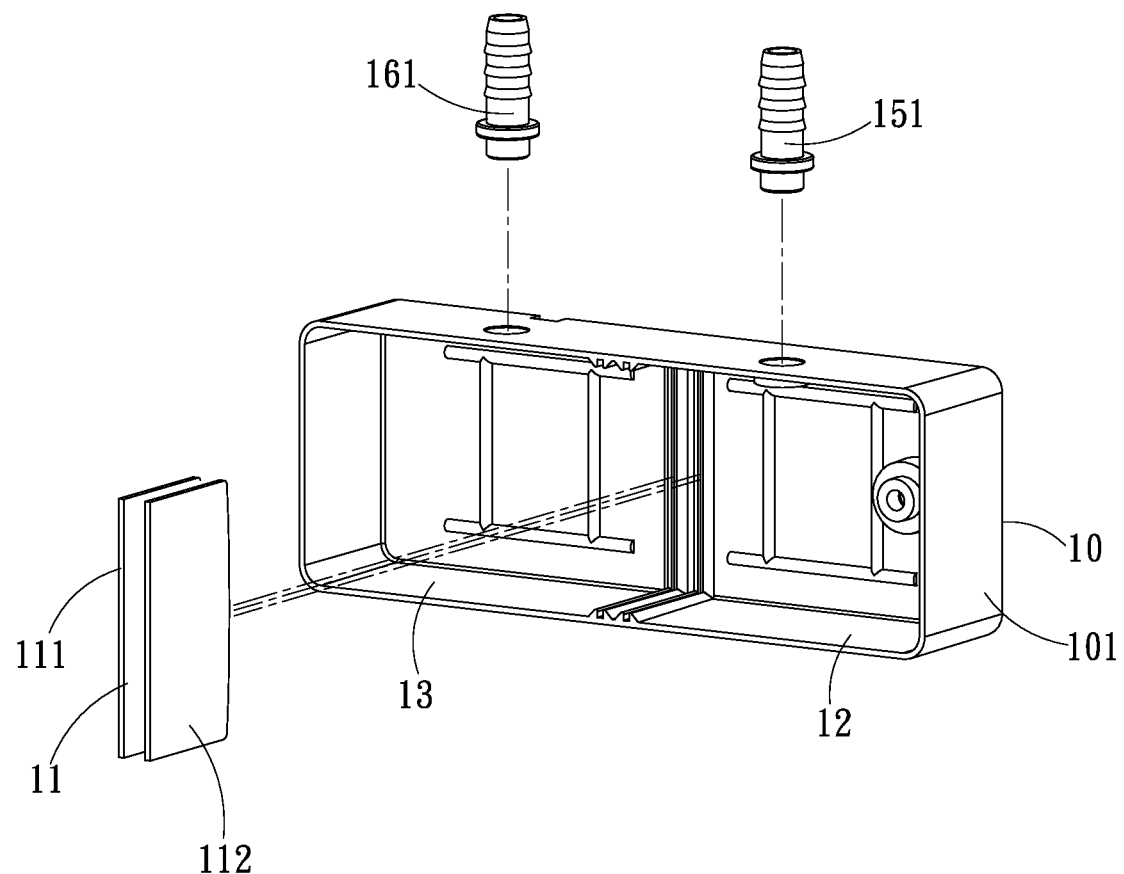
FIG. 9 is an exploded schematic view of the shunt box in FIG. 8 according to a first viewing angle of the present invention.
Figure 10:
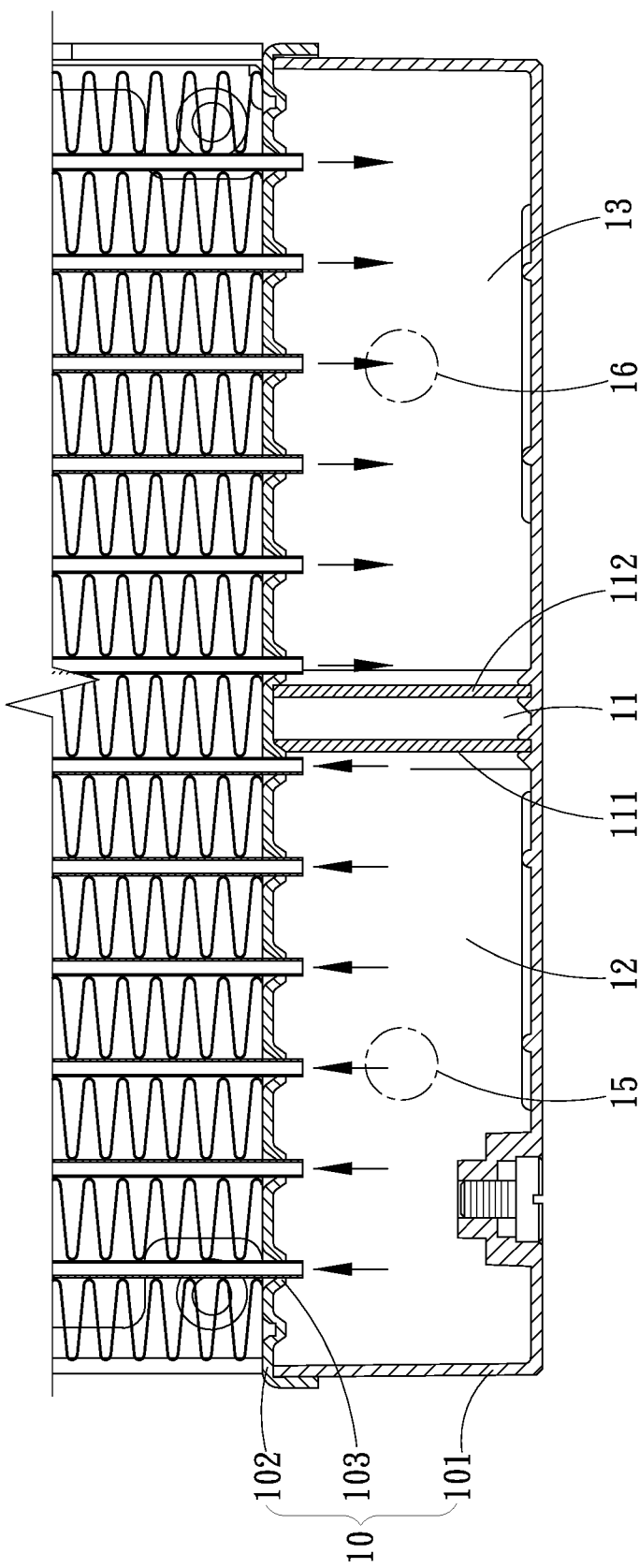
FIG. 10 is a schematic cross-sectional view of the shunt box and the heat-resistant space in FIG. 8 of the present invention.

As shown in FIG. 8, FIG. 9 and FIG. 10, it is a second preferred embodiment of a liquid cooling radiator for liquid coolers of the present invention. It also implements a shunt box 10, a liquid collection box 20, and a plurality of heat dissipation pipes 30, but the above-mentioned liquid pump 40 is not installed in the shunt box 10, but is implemented outside the liquid cooling radiator The inner space of the shunt box 10 is also implemented with the above-mentioned heat-resistant space 11, hot liquid baffle 111 and cold liquid baffle 112, which divides the inner space of the shunt box 10 into a hot liquid inlet chamber 12 and a cold liquid outlet chamber 13. Different from the above-mentioned embodiment, because the above-mentioned liquid pump 40 is not provided in this embodiment, the shunt box 10 of this embodiment does not implement the liquid pump installation cavity 14, so that its cold liquid outlet 16 is directly connected to the cold liquid outlet chamber 13 and outside the box wall. The cold liquid outlet 16 is also combined with a liquid outlet pipe 161.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A liquid cooling radiator for liquid coolers, comprising a shunt box, a liquid collection box, a plurality of heat dissipation pipes and a liquid pump, wherein:

said shunt box is a metal one-piece rectangular box, said shunt box comprising an internal space divided into a hot liquid inlet chamber and a cold liquid outlet chamber by a heat-resistant space so that said hot liquid inlet chamber and said cold liquid outlet chamber are isolated from each other, said hot liquid inlet chamber and said cold liquid outlet chamber being arranged side by side with each other, said cold liquid outlet chamber defining therein a liquid pump installation cavity, said hot liquid inlet chamber comprising a hot liquid inlet through a wall thereof, said hot liquid inlet being combined with a liquid inlet pipe, said liquid pump installation cavity being recessed into said cold liquid outlet chamber from an outer box wall of said shunt box, said liquid pump installation cavity comprising a peripheral wall, a bottom wall and a liquid outlet, said peripheral wall having one end thereof integrally connected to an inner box wall of said cold liquid outlet chamber and an opposite end thereof integrally connected to said bottom wall, so that said liquid pump installation cavity has an installation cavity opening facing out of said shunt box, said liquid outlet being set on said bottom wall and connecting said cold liquid outlet chamber with said liquid pump installation cavity, said liquid pump installation cavity comprising a cold liquid outlet through a wall thereof, said cold liquid outlet being combined with a liquid outlet pipe;

said heat-resistant space divides the said internal space of said shunt box into said hot liquid inlet chamber and said cold liquid outlet chamber, said heat-resistant space being composed of a hot liquid baffle and a cold liquid baffle assembled at intervals in the said internal space of said shunt box, said hot liquid baffle and said cold liquid baffle being welded to an internal box wall of the said internal space of said shunt box, said hot liquid inlet chamber and said cold liquid outlet chamber being isolated from said heat-resistant space, so that said heat-resistant space is formed between said hot liquid baffle and said cold liquid baffle to prevent said hot liquid baffle and said cold liquid baffle from contacting each other to transfer heat;

said liquid collection box is a metal integrally formed rectangular box, said liquid collection box being set at a distance from said shunt box, said liquid collection box having an internal space forming a liquid collection chamber, each of a part of said heat dissipation pipes having a first end thereof passing through the said outer box wall of said shunt box and communicating with said hot liquid inlet chamber, and each of the other part of said heat dissipation pipes having a first end thereof passing through the said outer box wall of said shunt box and communicating with said cold liquid outlet chamber, each of said heat dissipation pipes having an opposite second end thereof passing through a box wall of said liquid collection box and communicating with said liquid collection chamber, said liquid pump being set within said liquid pump installation cavity and closing said installation cavity opening, said liquid pump being capable of driving a hot liquid in said hot liquid inlet chamber of said shunt box to flow through said heat dissipation pipes to said liquid collection chamber of said liquid collection box and then flow from said liquid collection chamber to said cold liquid outlet chamber of said shunt box via said heat dissipation pipes to make said hot liquid cool down into a cold liquid, said cold liquid then flowing into said liquid pump installation cavity through said liquid outlet and then flowing out from said cold liquid outlet and said liquid outlet pipe;

wherein said heat dissipation pipes are aluminum alloy pipes with elongated section, each said heat dissipation pipe having at least one heat conducting metal plate set therein, each said heat conducting metal plate being integrally connected between two opposite pipe walls of the respective said heat dissipation pipe, so contact areas between the heat dissipation pipes and the hot liquid is increased, and heat conduction between the hot liquid and the heat dissipation pipes is improved, thus the heat dissipation effect can be improved and the structural strength of the pipes is enhanced;

wherein said shunt box comprises at least one rib integrally formed on an inner box wall thereof; and said heat-resistant space is further provided with a heat shield made of a lower heat conduction material and arranged within the heat-resistant space, wherein the heat shield is situated between the hot liquid baffle and the cold liquid baffle to provide a heat insulation effect.

2. The liquid cooling radiator for liquid coolers as claimed in claim 1, wherein said shunt box comprises four protrusions protruding an inner box wall thereof into said cold liquid outlet chamber and four screw holes located in said installation cavity opening of the outer box wall thereof and respectively recessed into said protrusions; said liquid pump closes said installation cavity opening and screws are passed through said liquid pump and respectively locked into said screw holes.

3. The liquid cooling radiator for liquid coolers as claimed in claim 2, wherein said shunt box further comprises a slot located on the outer box wall thereof and recessed from the outer box wall to the inner box wall of said shunt box, said installation cavity opening and said screw holes are located at a bottom of said slot; said liquid pump comprises a liquid pump cover, a motor stator and an impeller rotor, said liquid pump cover being embedded in said slot, said liquid pump cover having a ring groove located on an outer side thereof and concave toward an inner side thereof, said liquid pump cover having a concave hole located on an inner side thereof and concave toward an outer side thereof, said concave hole being concentric with said ring groove, said motor stator being set in said ring groove to close said ring groove, said impeller rotor being set in said concave hole, said motor stator driving said impeller rotor to rotate in said liquid pump installation cavity.

4. The liquid cooling radiator for liquid coolers as claimed in claim 3, wherein said shunt box comprises a shunt box body and a shunt box cover, said shunt box body comprising an end wall and a plurality of side walls connected around said end wall to form the said internal space of said shunt box, said shunt box cover closing an opening end of the said internal space, said shunt box cover being provided with a plurality of pipe jacks connected to said hot liquid inlet chamber and said cold liquid outlet chamber; the first ends of said heat dissipation pipes passing through said pipe jacks to connect to said hot liquid inlet chamber and said cold liquid outlet chamber respectively.

5. A liquid cooling radiator for liquid coolers, comprising a shunt box, a liquid collection box, a plurality of heat dissipation pipes and a liquid pump, wherein:

said shunt box is a metal one-piece rectangular box, said shunt box comprising an internal space divided into a hot liquid inlet chamber and a cold liquid outlet chamber, said hot liquid inlet chamber and said cold liquid outlet chamber being arranged side by side and isolated from each other, said hot liquid inlet chamber comprising a hot liquid inlet through a wall thereof, said hot liquid inlet being combined with a liquid inlet pipe, said cold liquid outlet chamber comprising a cold liquid outlet through a wall thereof, said cold liquid outlet being combined with a liquid outlet pipe;

said shunt box comprises a heat-resistant space set in the internal space thereof, said heat-resistant space dividing the said internal space of said shunt box into said hot liquid inlet chamber and said cold liquid outlet chamber, § aid heat-resistant space being composed of a hot liquid baffle and a cold liquid baffle assembled at intervals in the said internal space of said shunt box, said hot liquid baffle and said cold liquid baffle being welded to an internal box wall of the said internal space of said shunt box, said hot liquid inlet chamber and said cold liquid outlet chamber being isolated from said heat-resistant space, so that said heat-resistant space is formed between said hot liquid baffle and said cold liquid baffle to prevent said hot liquid baffle and said cold liquid baffle from contacting each other to transfer heat;

said liquid collection box is a metal integrally formed rectangular box, said liquid collection box being set at a distance from said shunt box, said liquid collection box having an internal space forming a liquid collection chamber;

each of a part of said heat dissipation pipes has a first end thereof passing through a box wall of said shunt box and communicating with said hot liquid inlet chamber, and each of the other part of said heat dissipation pipes having a first end thereof passing through the box wall of said shunt box and communicating with said cold liquid outlet chamber, each of said heat dissipation pipes having an opposite second end thereof passing through a box wall of said liquid collection box and communicating with said liquid collection chamber;

wherein said heat dissipation pipes are aluminum alloy pipes with elongated section, each said heat dissipation pipe having at least one heat conducting metal plate set therein, each said heat conducting metal plate being integrally connected between two opposite pipe walls of the respective said heat dissipation pipe, so contact areas between the heat dissipation pipes and the hot liquid is increased, and heat conduction between the hot liquid and the heat dissipation pipes is improved, thus the heat dissipation effect can be improved and the structural strength of the pipes is enhanced;

wherein said shunt box comprises at least one rib integrally formed on an inner box wall thereof; and said heat-resistant space is further provided with a heat shield made of a lower heat conduction material and arranged within the heat-resistant space, wherein the heat shield is situated between the hot liquid baffle and the cold liquid baffle to provide a heat insulation effect.

6. The liquid cooling radiator for liquid coolers as claimed in claim 5, wherein said shunt box comprises a shunt box body and a shunt box cover, said shunt box body comprising an end wall and a plurality of side walls connected around said end wall to form the said internal space of said shunt box, said shunt box cover closing an opening end of the said internal space, said shunt box cover being provided with a plurality of pipe jacks connected to said hot liquid inlet chamber and said cold liquid outlet chamber; the first ends of said heat dissipation pipes passing through said pipe jacks to connect to said hot liquid inlet chamber and said cold liquid outlet chamber respectively.

* * * * *